United States Patent
Thorum et al.

(10) Patent No.: US 10,784,101 B2
(45) Date of Patent: Sep. 22, 2020

(54) USING SACRIFICIAL SOLIDS IN SEMICONDUCTOR PROCESSING

(71) Applicant: Micron Technology, Inc., Boise, ID (US)

(72) Inventors: Matthew S. Thorum, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 15/847,512

(22) Filed: Dec. 19, 2017

(65) Prior Publication Data

US 2019/0189424 A1 Jun. 20, 2019

(51) Int. Cl.
*H01L 21/02* (2006.01)
*H01L 21/677* (2006.01)
*H01L 21/311* (2006.01)

(52) U.S. Cl.
CPC .. *H01L 21/02057* (2013.01); *H01L 21/31138* (2013.01); *H01L 21/67745* (2013.01)

(58) Field of Classification Search
CPC ......... H01L 21/02057; H01L 21/31138; H01L 21/67745; H01L 21/76837; H01L 21/67028; H01L 2224/10155; H01L 2224/11019; H01L 21/67034
See application file for complete search history.

(56) References Cited

U.S. PATENT DOCUMENTS

| | | | |
|---|---|---|---|
| 7,749,909 B2 | 7/2010 | Tomita et al. | |
| 8,617,993 B2 | 12/2013 | Yasseri et al. | |
| 9,653,307 B1 | 5/2017 | Imonigie et al. | |
| 2011/0139083 A1 | 6/2011 | Krone et al. | |
| 2011/0189858 A1 | 8/2011 | Yasseri et al. | |
| 2013/0081301 A1 | 4/2013 | Gouk et al. | |
| 2015/0118821 A1 | 4/2015 | Millward et al. | |
| 2015/0128991 A1 | 5/2015 | Brown et al. | |
| 2016/0042945 A1 | 2/2016 | Limary et al. | |
| 2016/0086829 A1* | 3/2016 | Limary | F26B 5/00 216/87 |

(Continued)

FOREIGN PATENT DOCUMENTS

| TW | 201423999 A | 6/2014 |
|---|---|---|
| TW | 201707053 A | 2/2017 |

(Continued)

OTHER PUBLICATIONS

Buriak "Organometallic Chemistry on Silicon and Germanium Surfaces", Chemical Reviews, vol. 102, No. 5, Mar. 8, 2002, pp. 1271-1308.

(Continued)

*Primary Examiner* — Bilkis Jahan
*Assistant Examiner* — Victor V Barzykin
(74) *Attorney, Agent, or Firm* — Brooks, Cameron & Huebsch, PLLC

(57) ABSTRACT

In an example, a method may include closing an opening in a structure with a sacrificial material at a first processing tool, moving the structure from the first processing tool to a second processing tool while the opening is closed, and removing the sacrificial material at the second processing tool. The structure may be used in semiconductor devices, such as memory devices.

7 Claims, 10 Drawing Sheets

(56) References Cited

U.S. PATENT DOCUMENTS

| | | | |
|---|---|---|---|
| 2016/0097590 A1* | 4/2016 | Sirard | ............... H01L 21/67034 |
| | | | 34/418 |
| 2016/0099160 A1* | 4/2016 | Sirard | ............... H01L 21/67028 |
| | | | 438/694 |
| 2016/0254162 A1 | 9/2016 | Okutani et al. | |
| 2016/0363868 A1 | 12/2016 | Somervell et al. | |
| 2017/0040154 A1* | 2/2017 | Kagawa | ............... H01L 21/0206 |
| 2017/0069573 A1 | 3/2017 | Ting et al. | |
| 2017/0250094 A1 | 8/2017 | Verhaverbeke et al. | |
| 2017/0345683 A1* | 11/2017 | Sasaki | ...................... B08B 3/02 |
| 2020/0013779 A1 | 1/2020 | Chiang et al. | |

FOREIGN PATENT DOCUMENTS

| | | |
|---|---|---|
| TW | 201715615 A | 5/2017 |
| WO | 2017-207452 A1 | 12/2017 |

OTHER PUBLICATIONS

Chen, et al. "Non-Stiction Performance of Various Post Wet-Clean Drying Schemes on High-Aspect-Ratio Device Structures", The Electrochemical Society, vol. 58, Issue 6, 1 pp.

Chen, et al. "Non-Stiction Performance of Various Post Wet-Clean Drying Schemes on High-Aspect-Ratio Device Structures", The Electrochemical Society, vol. 58, Issue 6, 2013, 1 pp.

International Search Report and Written Opinion from related international application No. PCT/US2018/063956, dated Apr. 30, 2019, 12 pp.

Office Action from related Taiwan patent application No. 107143811, dated Jul. 12, 2019, 11 pages.

Notice of Rejection Ground from related Taiwan patent application No. 107143811, dated Nov. 28, 2019, 5 pages.

\* cited by examiner

USING SACRIFICIAL SOLIDS IN SEMICONDUCTOR PROCESSING

TECHNICAL FIELD

The present disclosure relates generally to semiconductor processing, and, more particularly, to using sacrificial solids in semiconductor processing.

BACKGROUND

Semiconductor processing (e.g., fabrication) can be used to form semiconductor devices, such as integrated circuits, memory devices, microelectromechanical devices (MEMS), etc.

Examples of memory devices that can be formed by semiconductor processing include, but are not limited to, volatile memory (e.g., that can require power to maintain its data), such as random-access memory (RAM), dynamic random access memory (DRAM), synchronous dynamic random access memory (SDRAM), among others, and non-volatile memory (e.g., that can provide persistent data by retaining stored data when not powered), such as NAND flash memory, NOR flash memory, read only memory (ROM), electrically erasable programmable ROM (EEPROM), erasable programmable ROM (EPROM), among others.

Semiconductor processing can involve forming features (e.g., patterns) on and/or in a semiconductor (e.g., of silicon) that may be referred to as a wafer or substrate. In some examples, one or more materials, such as silicon-based materials (e.g., silicon oxide (SiO), silicon nitride (SiN), tetraethyl orthosilicate (TEOS), and/or polysilicon) may be formed on the semiconductor. For instance, a deposition process, such as physical vapor deposition (PVD), chemical vapor deposition (CVD), atomic layer deposition (ALD), electrochemical deposition and/or molecular beam epitaxy, among others may be used to form one or more materials on the semiconductor.

Subsequently, portions of the one or more materials, and in some instances, portions of the semiconductor, may be removed, such as by wet and/or dry etching, to form the features. In some examples, the features may have high aspect ratios (e.g., ratio of height to width or diameter) and may be referred to as high-aspect-ratio (HAR) features. For example, the features might be separated from each other by HAR openings.

During processing, the semiconductor and the features may be subjected to wet processing, such as wet cleaning, and subsequent drying. For example, wet cleaning can be helpful to remove residue left behind, such as by the removal process or other processing.

DETAILED DESCRIPTION

The present disclosure includes processing methods associated with forming semiconductor devices, such as integrated circuits, memory devices MEMS, among others. A number of embodiments include methods of forming semiconductor devices, comprising: closing an opening in a structure with a solid sacrificial material at a first processing tool, moving the structure from the first processing tool to a second processing tool while the opening is closed, and removing the sacrificial material at the second processing tool. The structure may be used in semiconductor devices, such as integrated circuits, memory devices, MEMS, among others.

Embodiments of the present disclosure provide technical advantages, such as reducing the likelihood of feature collapse (e.g. toppling) during processing compared to previous approaches. For instance, a number of embodiments form a sacrificial material in openings between features in a structure, such as a structure to be used in a semiconductor device (e.g., a memory device), that acts to prevent feature collapse (e.g., sometimes referred to as pattern collapse) while the structure is being moved from one processing tool to another processing tool during processing (e.g., formation of the semiconductor device).

Some prior approaches can include forming features in a structure at a dry etch tool, such as by dry etching, and moving the structure to a wet cleaning tool (e.g., to clean residue from the dry etch from the structure). After cleaning, the structure may be moved to a deposition tool that may add additional material to the structure. However, the structures may be exposed to moisture-containing air as they are being moved from tool to tool.

Figure 1:
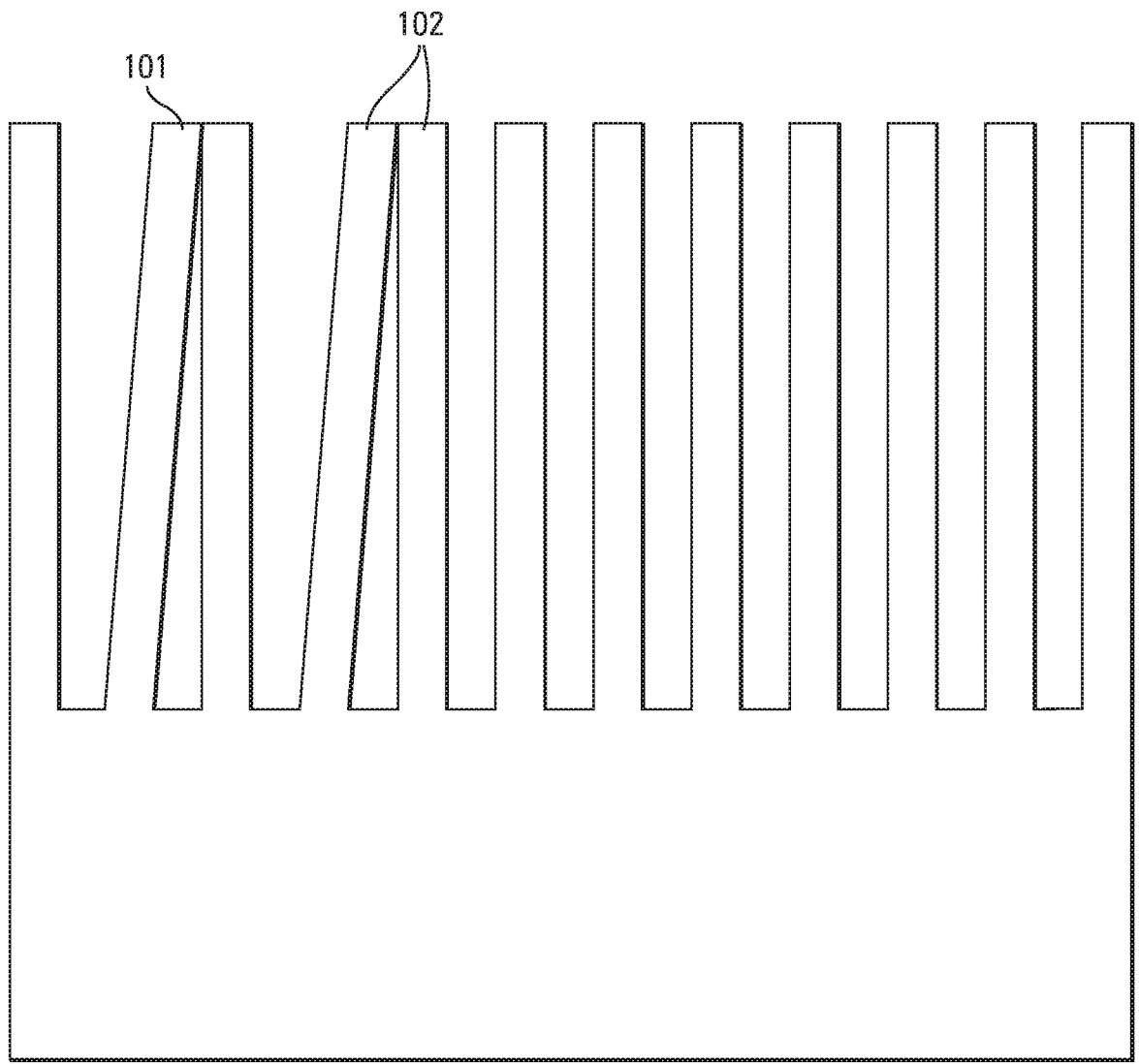
FIG. 1 presents various examples of feature toppling.

For instance, water vapor from the air can condense on surfaces of structures (e.g., forming liquid condensate) as they are being moved. This can be a problem for structures having small openings between features, such as HAR features. For example, the liquid condensate may form in the openings between the features. High surface tension forces may result from the liquid in the openings that can cause the features to topple (e.g., collapse) toward each other, bringing adjacent features into contact with each other. For example, FIG. 1 illustrates a feature 101 toppling (e.g., collapsing) into an adjacent feature and a pair of adjacent features 102 toppling into each other (e.g. in what is sometimes referred to as bridging). This can lead to defects in the semiconductor device structure, and can even render the semiconductor device inoperable.

The sacrificial materials of the embodiments described herein close the openings to prevent liquid condensate from forming in the openings while the structures are being moved from tool to tool, and thus can reduce the likelihood of (e.g., eliminate) toppling.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

The figures herein follow a numbering convention in which the first digit or digits correspond to the drawing figure number and the remaining digits identify an element or component in the drawing. Similar elements or components between different figures may be identified by the use of similar digits. For example, 211 may reference element "11" in FIG. 2A, and a similar element may be referenced as 311 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIGS. 2A-2F illustrate cross-sectional views of processing steps associated with forming a semiconductor device, such as a portion of an integrated circuit, a memory device, a MEMS, among others, in accordance with a number of embodiments of the present disclosure. For example, the processing steps may be associated with forming (e.g., a memory array of) a DRAM memory device, a NAND flash memory device, a NOR flash memory device, among others.

Figure 2A:
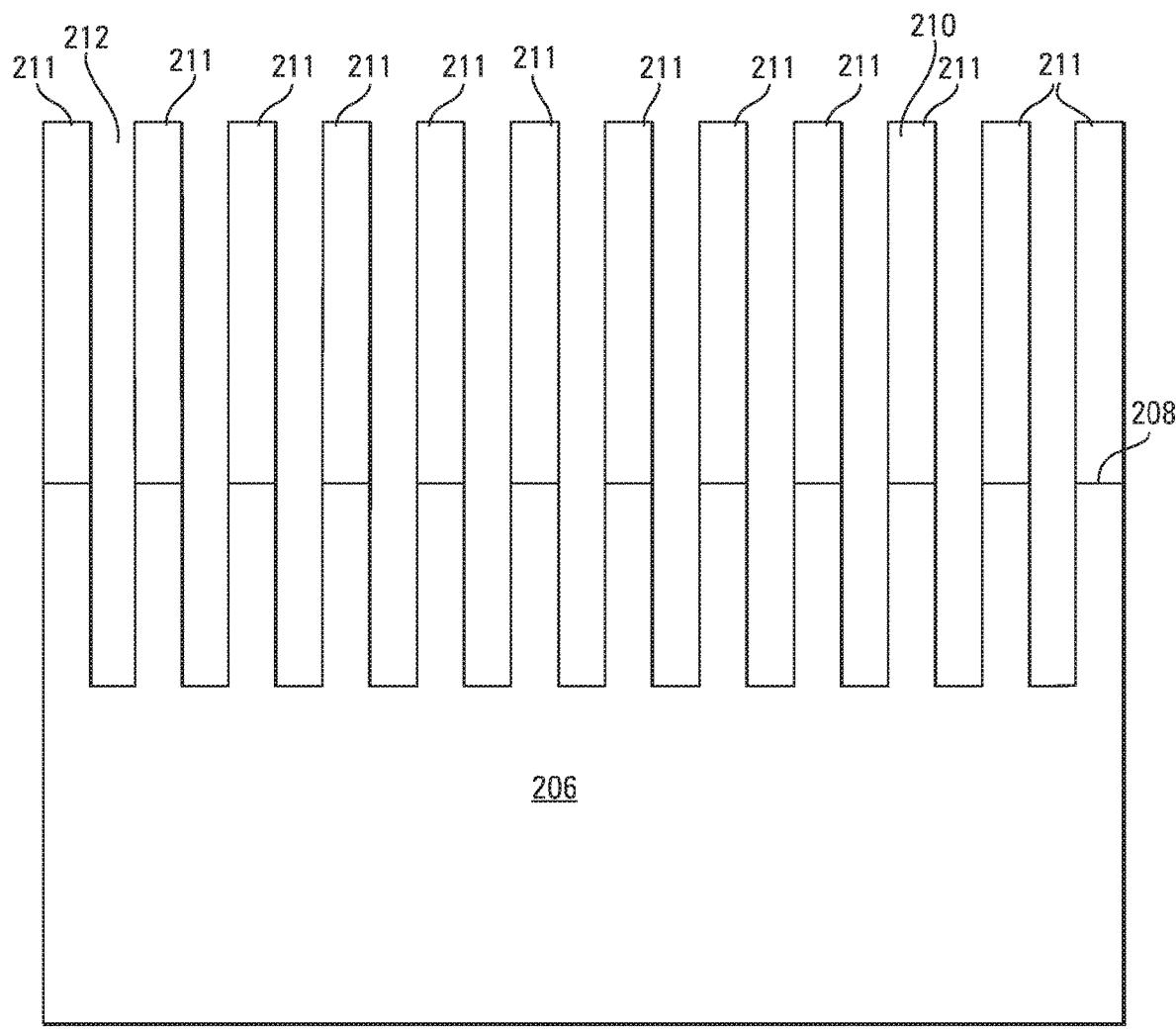
FIGS. 2A-2F illustrate cross-sectional views of processing steps associated with forming a semiconductor device, in accordance with a number of embodiments of the present disclosure.

FIG. 2A depicts a structure (e.g., to be used in a semiconductor device) after several processing steps have occurred. The structure may include a base structure, such as a substrate 206 (e.g., a semiconductor). In some examples, one or more materials 210, such as silicon-based materials, may be formed on (e.g., over) a surface 208, such as an upper surface, of semiconductor 206, using, for example, a deposition process, such as PVD, CVD, ALD, electrochemical deposition and/or molecular beam epitaxy, among others.

Features 211, such as nanofeatures (e.g., having a width or diameter of about 0.1 nanometer to about 100 nanometer) are formed by removing portions of the structure, such as portions of the one or more materials 210 and portions of semiconductor 206. The removal process forms openings 212, such as spaces (e.g., trenches), through the one or more materials 210, stopping on or in (e.g., as shown in FIG. 2A) semiconductor 206. For example, an opening 212 may be between adjacent features 211. In some examples, each of the respective features 211 includes the one or more materials 210 and a portion of semiconductor 206.

In some examples, portions of the openings 212 in semiconductor 206 (e.g., below surface 208) may correspond to isolation regions, such as shallow trench isolation (STI) regions. In an example, a feature 211 may be entirely of semiconductor 206, and openings 212 may correspond to STI regions. Features 211 may be HAR features, and openings 212 may be HAR openings. For example, a HAR may have a height to width or diameter ratio of 10 to 1, 25 to 1, or greater.

Figure 4:
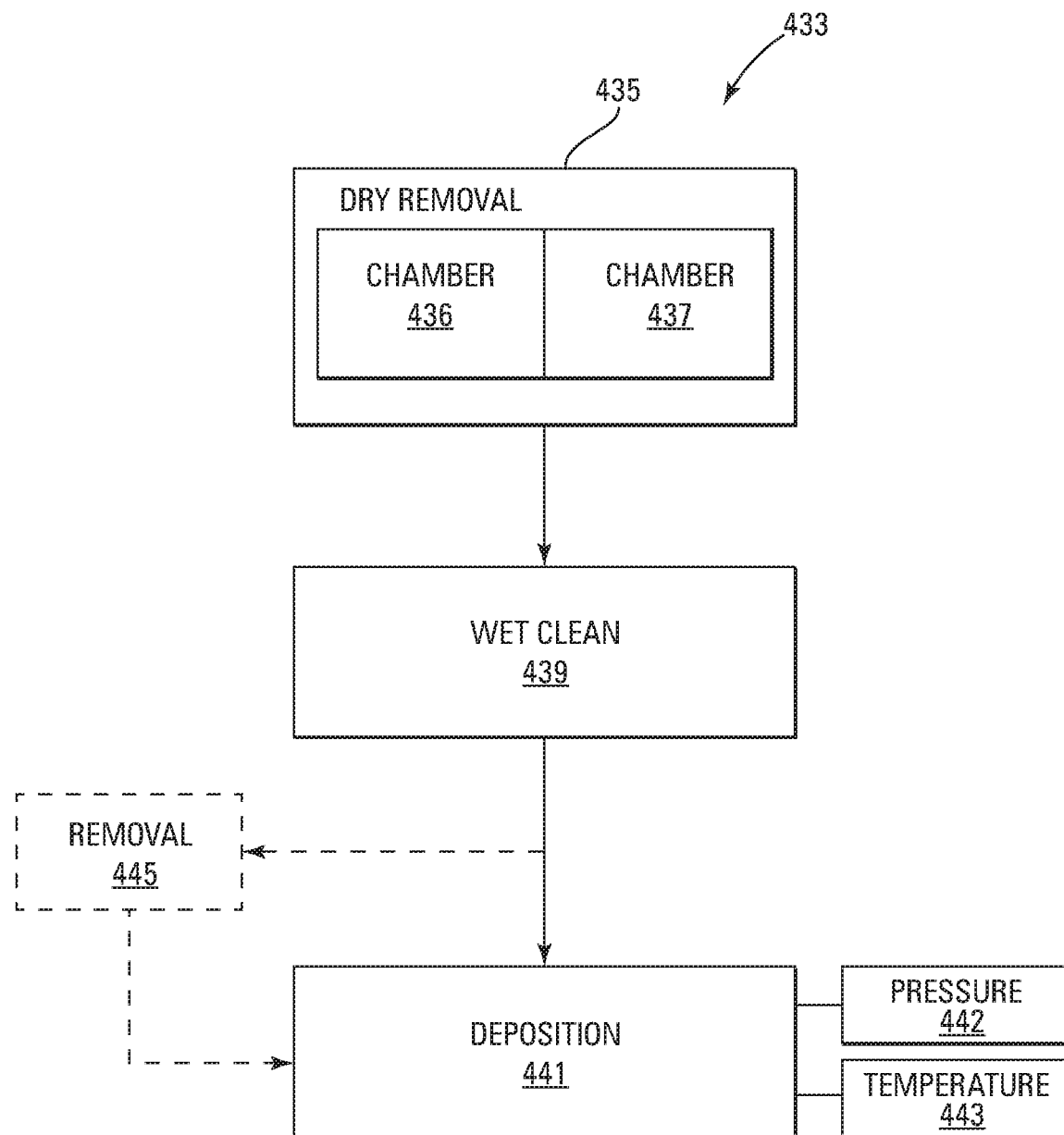
FIG. 4 is a block diagram illustration of a processing apparatus used in conjunction with the processing steps associated with forming a semiconductor device, in accordance with a number of embodiments of the present disclosure.

In some examples, openings 212, and thus the structure in FIG. 2A, may be formed using a dry processing tool, such as the dry removal tool 435 (e.g., dry etch tool) of the processing (e.g., semiconductor processing) apparatus 433 in FIG. 4, using a dry removal process, such as a dry etch. A mask (not shown), such as imaging resist (e.g., photoresist), may be formed over the one or more materials 210 and patterned to expose regions of the one or more materials 210. The exposed regions may be subsequently removed, such as by the dry etch process, to form openings 212 that may terminate on or in semiconductor 206.

Figure 2B:
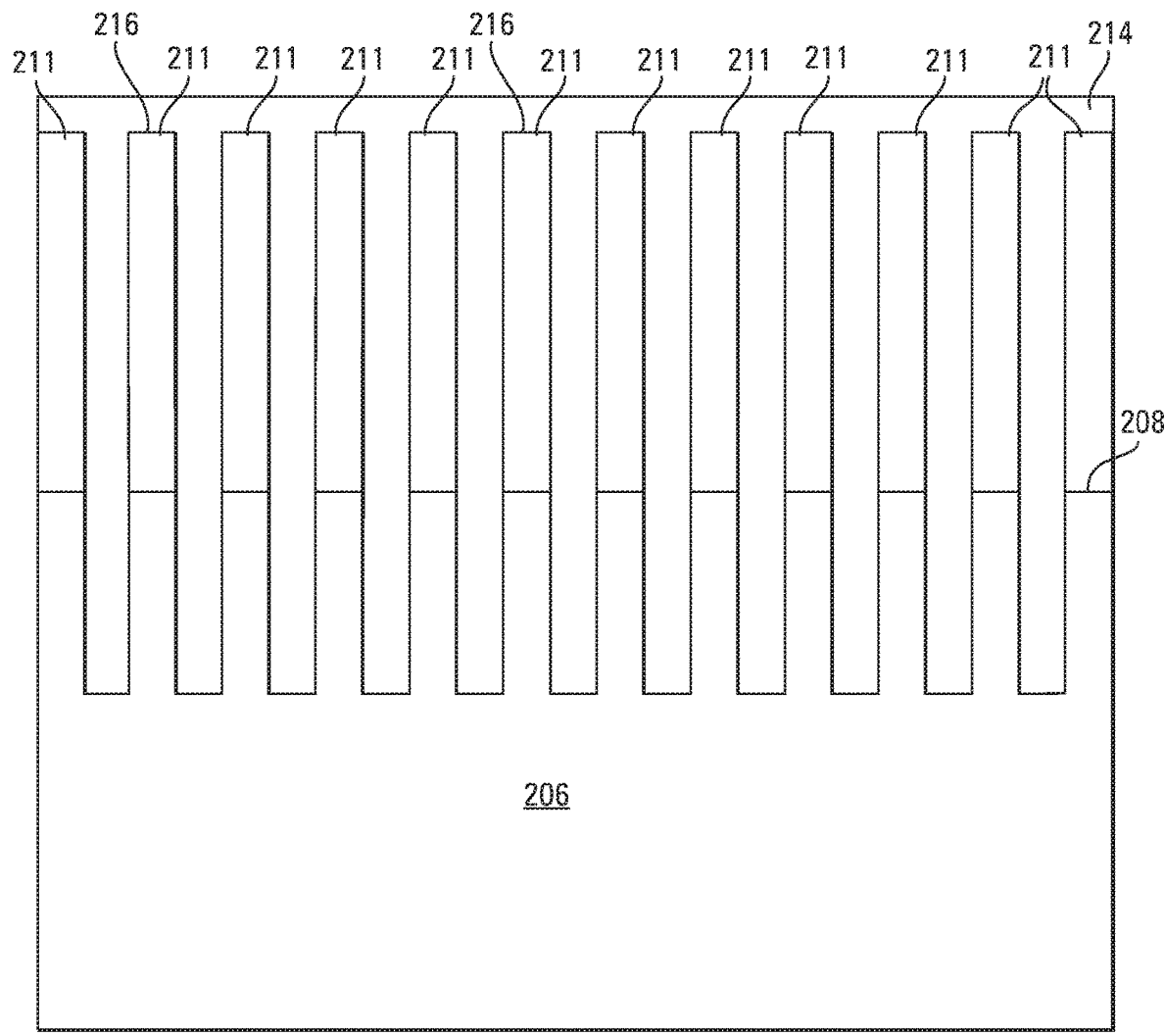

As shown in FIG. 2B, a sacrificial material 214, such as a dielectric material (e.g., silicon oxide, silicon nitride, etc.), an organic compound (e.g., an organic polymer), an ionic compound (e.g., an ammonium salt or a halide salt), a soluble material (e.g., soluble in a solvent, such as water, hydrofluoric acid (HF), etc.) among others, is formed on the structure of FIG. 2A to close openings 212. For example, ammonium salt and halide salt are water soluble and oxalic acid, acetamide, and urea are organic compounds that are soluble in water and organic solvents. In other examples, sacrificial material 214 may include semiconductors, such as silicon (e.g., for cases when the structure is of a material different that silicon, germanium, among others, or a conductor, such as a metal (e.g., tungsten, aluminum, titanium, titanium nitride, etc.), among others. In some examples, sacrificial material 214 can completely fill openings 212 such that an upper surface of sacrificial material 214 may be coplanar (e.g., flush) with the upper surfaces 216 of features 211. Additionally, as shown in FIG. 2B, sacrificial material 214 can overfill openings 212 and extend over (e.g., cover) upper surfaces 216 of features 211.

The sacrificial material 214 may be formed on the structure of FIG. 2A at dry removal tool 435, such as in the same processing chamber in which the dry etch is performed, before the resulting structure in FIG. 2B is exposed to a moisture-containing atmosphere, such as air. For example, sacrificial material 214 may be formed on the structure of FIG. 2A before any residue (e.g., etch residue) resulting from the dry etch forming features 211 is removed.

In some examples, different portions of the dry removal tool 435 (e.g., the dry removal tool frame) may be respectively located in different processing chambers, such as chambers 436 and 437 in FIG. 4. For example, the dry etch may be performed at one portion of the dry removal tool frame in chamber 436, and sacrificial material 214 may be formed at a different portion of the dry etch tool frame in chamber 437. The structure may be moved between the chambers in a vacuum to prevent condensation on features 211 (e.g., in openings 212) and oxidation of features 211.

Subsequently, the structure of FIG. 2B may be moved from one processing tool, such as the dry-etch processing tool, to a different processing tool, such as the wet cleaning tool 439 in FIG. 4. For example, the structure of FIG. 2B may be exposed to a moisture-containing atmosphere as it is moved from one tool to another. However, by closing openings 212 and covering features 211, sacrificial material 214 prevents condensation on features 211 in openings 212, and thus the toppling of features 211 resulting from the condensation. Sacrificial material 214 also protects features 211 from oxidation that can occur as the structure is being moved through an oxygen containing atmosphere, such as air. For example, oxidation can consume portions of features 211, and removal of the resulting oxides may alter the size and/or shape of features 211.

The wet cleaning tool 439 may be dedicated to performing wet cleaning that can remove the residues that may form as a result of the dry etch. In some examples, the composition of sacrificial material 214 may be selected based on the wet clean chemistry to be used for wet cleaning. For instance, the type of sacrificial material 214 to be used to fill openings 212 may be selected so it can be removed by the wet clean chemistry to be used for wet cleaning.

Figure 2C:
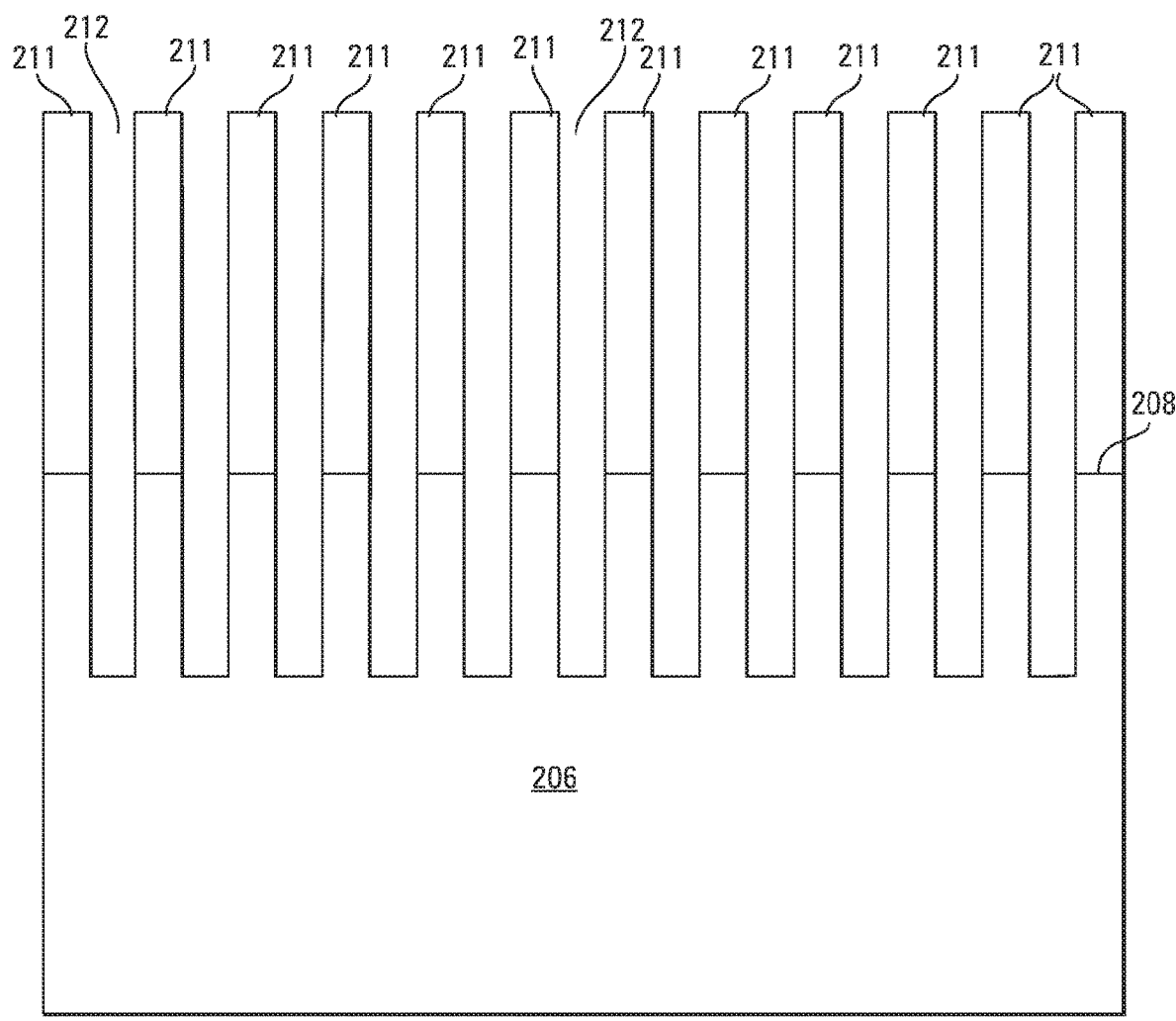

As shown in FIG. 2C, sacrificial material 214, as well as residual material from the dry-etch process, is removed from the structure of FIG. 2B via the wet clean at the wet cleaning tool 439 (e.g., as part of the wet cleaning process) to re-expose (e.g., reopen) the openings 212 between features 211. In an example, the wet cleaning process may be performed in a gas-free atmosphere so that the structure of FIG. 2C is not exposed to a gas.

In some examples the wet cleaning may include an aqueous wet clean that may include hydrofluoric acid (HF). In an example, an aqueous wet clean may include a standard clean-1 (SC-1) (e.g. for removing organics, particles, and films) that may include deionized (DI) water, aqueous ammonium hydroxide, and aqueous hydrogen peroxide. In some instances, a standard clean-2 (SC-2) (e.g., for removing metal ions) that may include deionized (DI) water, aqueous ammonium hydroxide, and aqueous hydrogen peroxide may be performed after SC-1 as part of the aqueous wet clean. The wet-cleaning process may further include the aqueous wet clean with a DI water rinse, followed by an isopropyl (IPA) rinse, followed by drying, such as spin drying, to form the structure of FIG. 2C. In other examples, wet cleaning process and the removal of the sacrificial 214 may be integrated, and the wet cleaning process may remove residue from the dry etch.

Figure 2D:
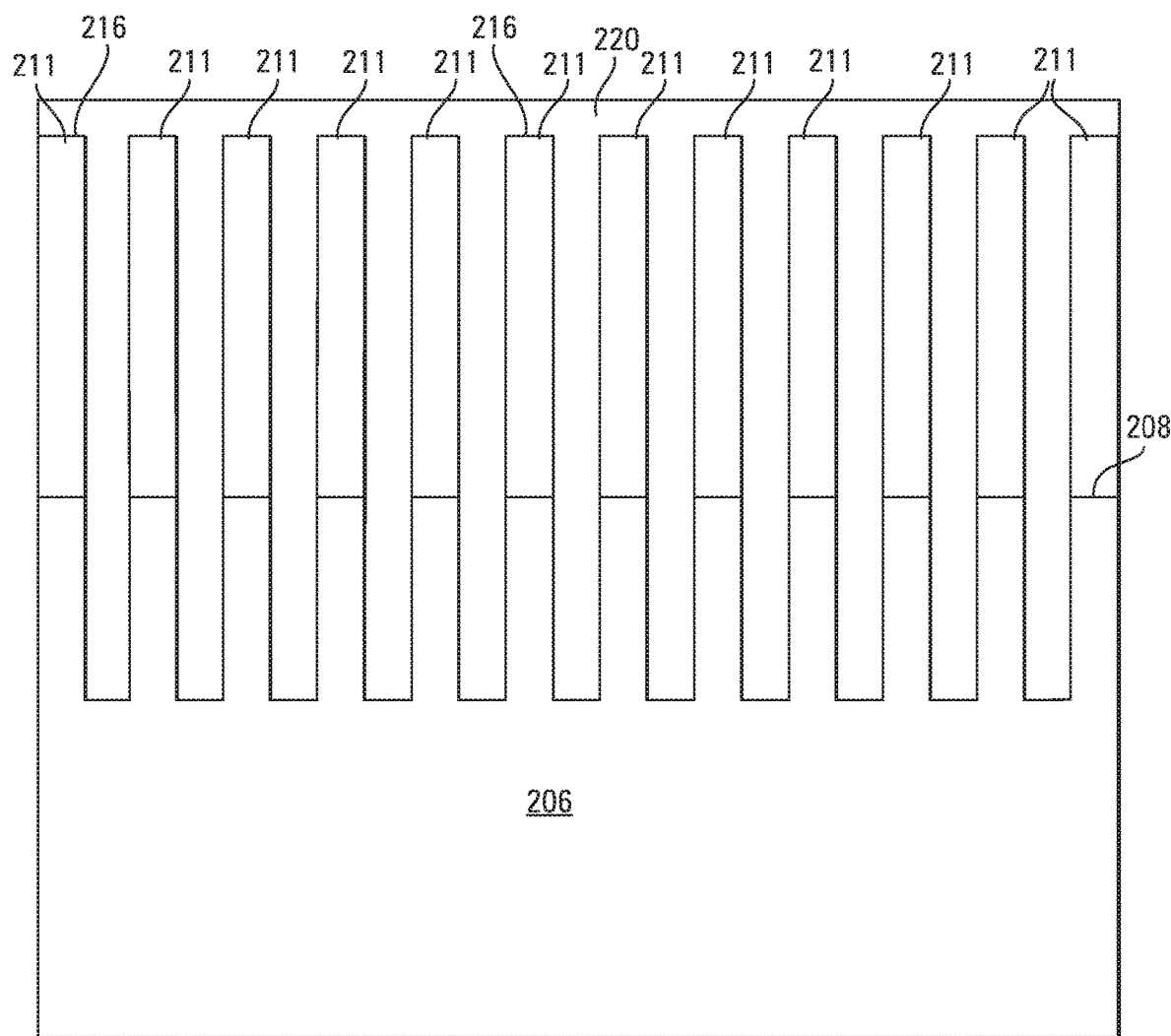

Subsequently, as shown in FIG. 2D, a sacrificial material 220, such as a volatile solid material, is formed on (e.g., is used to coat) the structure of FIG. 2C at the wet cleaning tool 439 to close openings 212 (e.g., without exposing the structure to a gas). For example, sacrificial material 220 may be spin coated onto the structure of FIG. 2C. In some examples, sacrificial material 220 closes openings 212 by completely filling openings 212. In some examples, sacrificial material 220 can completely fill openings 212 such that an upper surface of sacrificial material 214 may be coplanar (e.g., flush) with the upper surfaces 216 of features 211. Additionally, as shown in FIG. 2D, sacrificial material 214 can overfill openings 212 and extend over (e.g., cover) upper surfaces 216 of features 211. In some examples, sacrificial material 220 may completely displace any liquid from the wet cleaning process. Non-limiting examples of suitable volatile materials include camphor, ammonium acetate, camphene, naphthalene, and phenol, succinonitrile, trioxane, acetamide among others. In some examples, sacrificial material 220 may have a melting temperature between 25 Celsius and 80 Celsius. For example, such sacrificial materials may include camphene (e.g., melting temperature 52 Celsius), phenol (e.g., melting temperature 40 Celsius), succinonitrile (e.g., melting temperature 54 Celsius), trioxane (e.g., melting temperature 64 Celsius), naphthalene (e.g., melting temperature 80 Celsius), and acetamide (e.g., melting temperature 81 Celsius).

In some examples, the volatile material may be melted to create a liquid. The liquid can then be applied to the structure of FIG. 2C and allowed to solidify to form the structure of FIG. 2D. For instance, the liquid can be deposited on to the structure of FIG. 2C and into openings 212 in FIG. 2C and then solidified to form the structure of FIG. 2D. For example, the temperature of the semiconductor 206 may be reduced to below the solidification (e.g., freezing) temperature of the liquid to solidify the liquid. In some examples, the deposited liquid may displace any liquid from the wet cleaning process.

In other examples, the volatile material may be dissolved in a solvent to create a liquid solution. The solution may then be deposited into openings 212 in FIG. 2C. The solvent may then be evaporated, leaving the volatile material in openings 212.

Subsequently, the structure of FIG. 2D is moved from the wet cleaning tool to a different processing tool, such as the deposition tool 441 (see FIG. 4). For example, the structure of FIG. 2D may be exposed to a moisture-containing atmosphere as it is moved from the wet cleaning tool 439 to the deposition tool 441. However, by closing openings 212 and covering features 211, sacrificial material 220 prevents condensation on the features 211 and in openings 212, and thus the toppling of features 211 resulting from the condensation. Sacrificial material 220 may also protect features 211 from oxidation that can occur as the structure is being moved through an oxygen containing atmosphere.

Figure 2E:
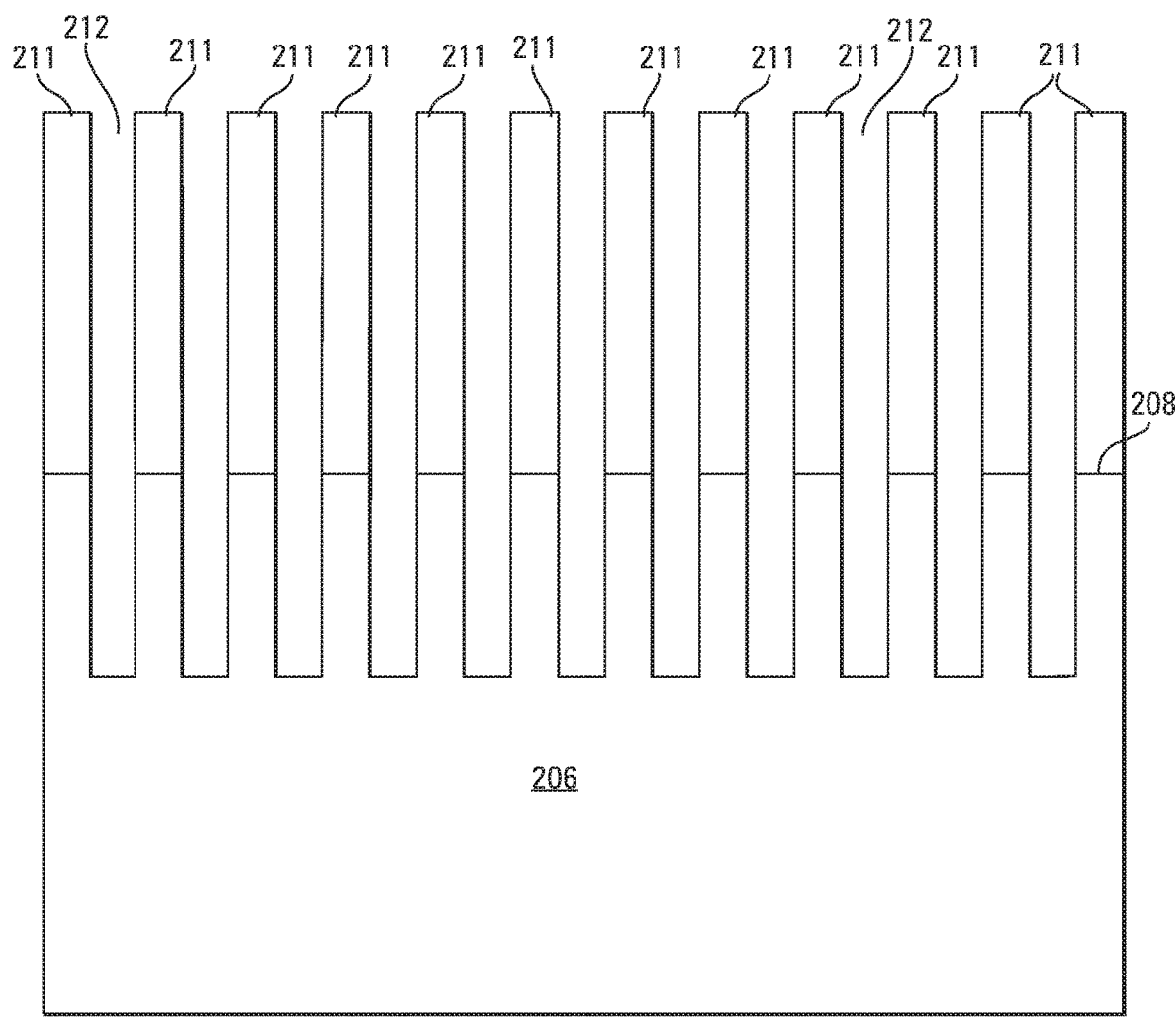

As shown in FIG. 2E, sacrificial material 220 may be removed at the deposition tool 441 to re-expose openings 212 between features 211. For examples in which sacrificial material 220 is a volatile material, sacrificial material 220 may be removed by sublimation. For instance, the pressure and temperature at the deposition tool may be set such that sacrificial material 220 sublimates. For example, the pressure may be controlled by a pressure controller 442 and temperature may be controlled by a temperature controller 443, as shown in FIG. 4.

In other examples, sacrificial material 220 may be a dielectric material, such as silicon oxide and/or silicon nitride, that is formed on the structure of FIG. 2C via deposition (e.g., by spin coating) to form the structure of FIG. 2D. For instance, sacrificial material 220 may be a spin on dielectric (SOD) material. The SOD material may be baked, but only partially densified, for example. In an alternative embodiment, the structure of 2D, including the SOD material, may be moved from the wet cleaning tool 439 to a different processing tool, such as the dedicated removal tool 445 (e.g., dedicated to removing the SOD material) shown in FIG. 4. For example, the structure of FIG. 2D may be exposed to a moisture-containing atmosphere as it is moved from the wet-cleaning tool 439 to the removal tool 445, while it is protected from the air by the SOD material. The SOD material may be removed at the removal tool 445 by a dry etch, such as a vapor etch (e.g., using vaporized HF if the SOD material is an oxide), to re-expose openings 212. Subsequently, the structure of FIG. 2E may be placed in a vacuum to reduce the likelihood of (e.g., to prevent) condensation and oxidation.

Figure 2F:
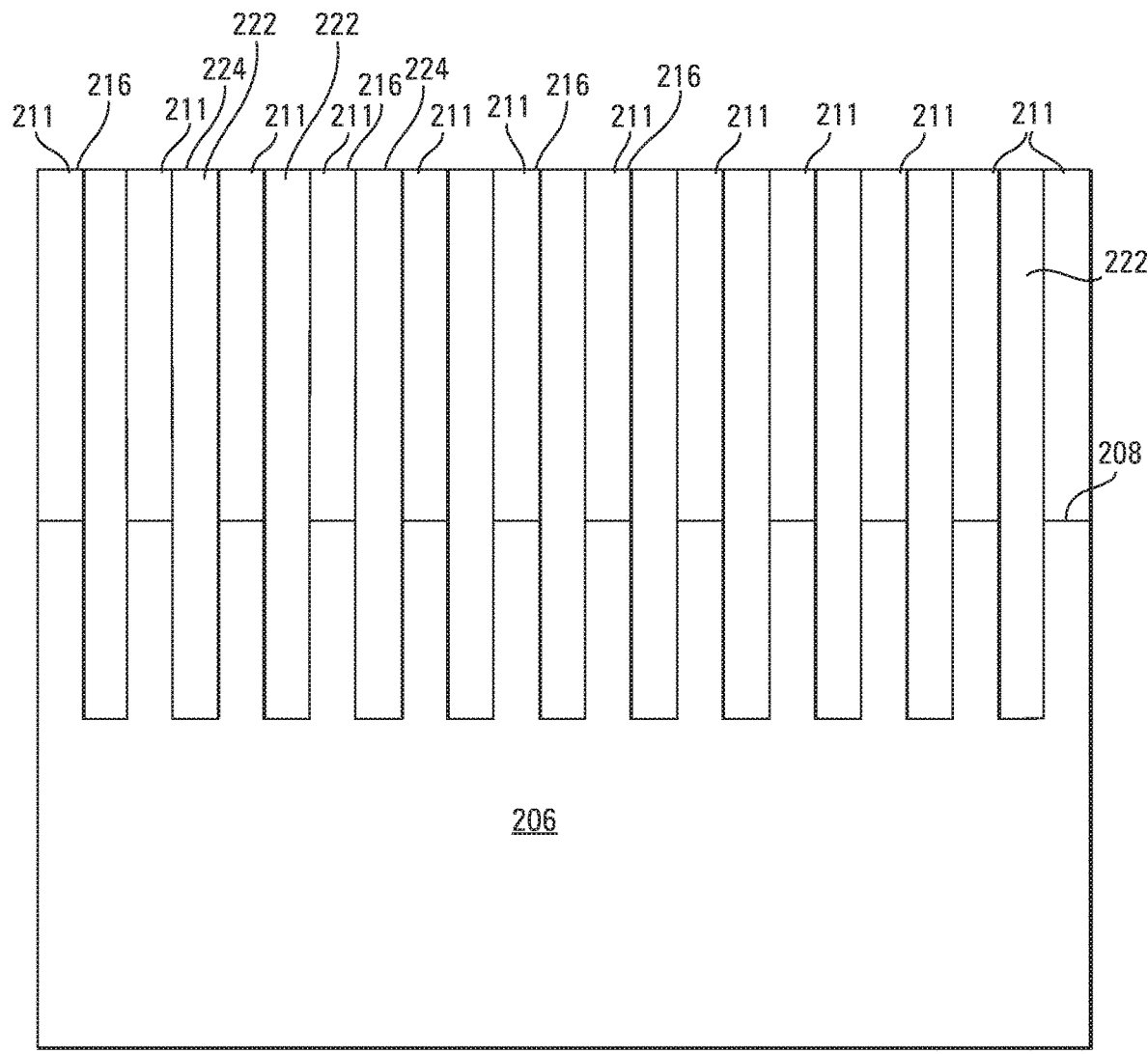

In some examples, as shown in FIG. 2F, a material 222 may be formed in the openings 212 in the structure of FIG. 2E at the deposition tool 441. For example, material 222 may be formed in a gaseous phase or a plasma phase, such as by PVD, CVD, ALD, among others. For example, material 222 might be an epitaxial silicon material or a dielectric material, such as silicon oxide or silicon nitride. In some examples, material 222 may overfill openings 212 and extend over the upper surfaces 216 of features 211. Subsequently, a portion of material 222 may be removed, such as by chemical mechanical planarization (CMP) so that upper surfaces 224 of material 222 are coplanar with upper surfaces 216, as shown in FIG. 2F.

In some examples, portions below surface 208 may be isolation regions. In examples in which features 211 may be comprised entirely of semiconductor 206, rather than a subsequently deposited material as previously described in conjunction with FIG. 2A, and the regions between features 211 containing solid material 222 may be isolation regions.

Figure 3:
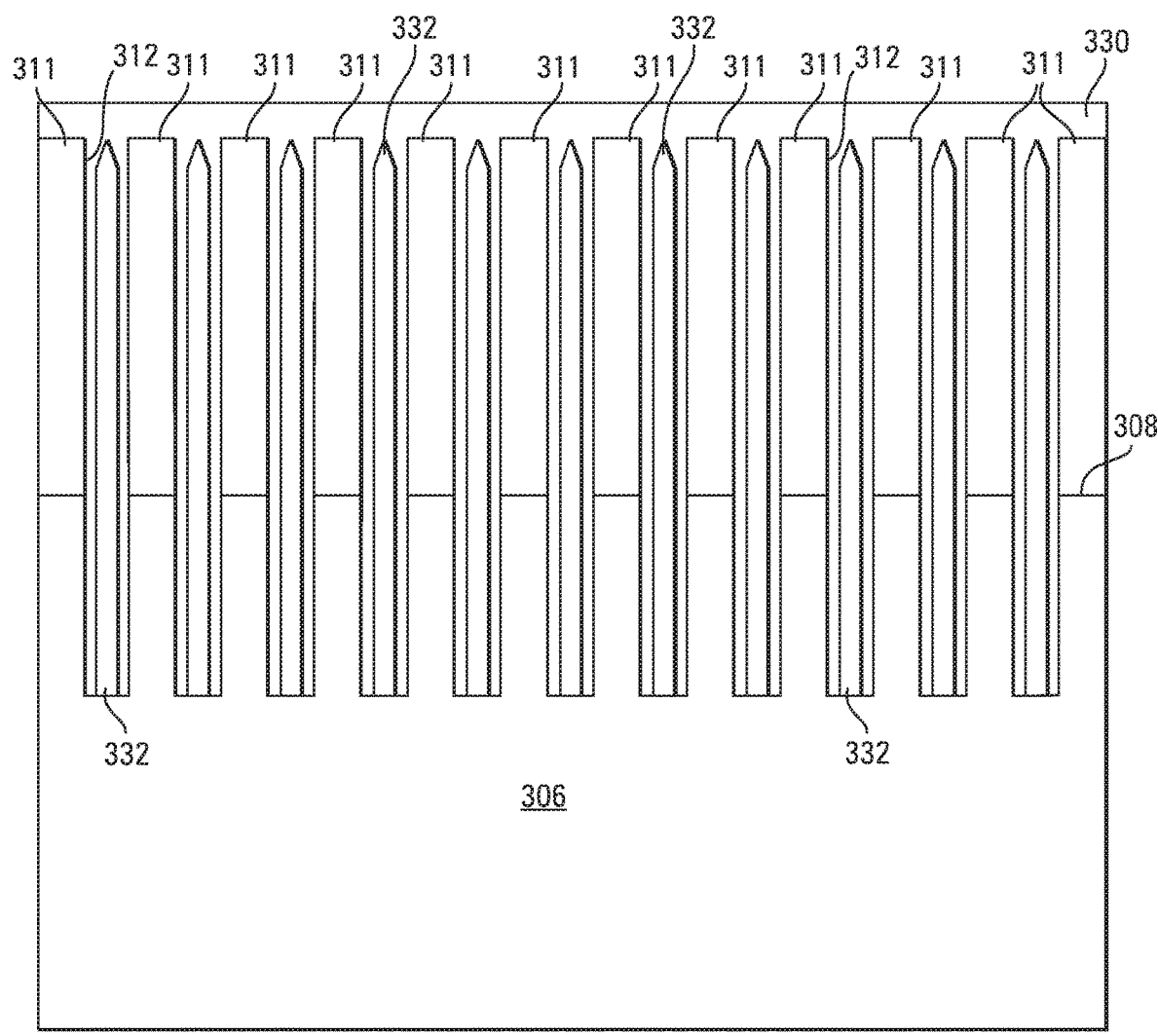
FIG. 3 an example of a processing step associated with forming a semiconductor device, in accordance with a number of embodiments of the present disclosure.

In some examples, openings 212 in the structure of FIG. 2A and in the structure of FIG. 2C may be closed without completely filling openings 212 with a sacrificial material, such as sacrificial material 214 in FIG. 2B or sacrificial material 220 in FIG. 2D. As shown in FIG. 3, a sacrificial material 330 may be formed on a structure, such as the structure of FIG. 2A or on the structure of FIG. 2C, to form the structure in FIG. 3. Sacrificial material 330 is formed in openings 312 between features 311 so that sacrificial material 330 closes the openings 312 adjacent to a top of the openings 312 without completely filling the openings 312. Sacrificial material 330 pinches off adjacent to the top of the openings before the openings are completely filled, leaving voids 332 between features 311. For example, sacrificial material 330 lines openings 312 and closes off openings 312 adjacent to the tops of openings 312 to create voids 332. For instance, the sacrificial material 330 is coupled between adjacent features 311 by spanning upper portions of the openings between the adjacent features 311.

In some examples, sacrificial material 330 may be sacrificial material 214, and the structure of FIG. 3 may be formed at the dry removal tool 435, as described previously. Subsequently, the structure of FIG. 3 may be moved from the dry removal tool (e.g., through moist air) to the wet cleaning tool 439. Sacrificial material 330 is then removed at the wet cleaning tool 435, as described previously, to from the structure of FIG. 2C.

In some examples, sacrificial material 330 may be sacrificial material 220, such as a volatile material or an SOD material, and the structure of FIG. 3 may be formed at the wet cleaning tool 439, as described previously. For example, in the case of sacrificial material 330 being a volatile material, the structure of FIG. 3 may be moved from the wet cleaning tool (e.g., through a moist atmosphere) to the deposition tool 441 at which sacrificial solid 330 may be removed by sublimation to form the structure of FIG. 2E, as described previously. In some examples, the structure of FIG. 3 may be formed by applying the volatile solid as a liquified solid and allowing the liquified solid to solidify. Alternatively, the structure of FIG. 3 may be formed by depositing the volatile solid from a solution by evaporating the solvent. In other examples, sacrificial material 330 may be deposited to partially fill openings 312 such that sacrificial material 330 is formed on features 311 within openings 312, as shown in FIG. 3, thus lining openings 312, but without pinching off.

In examples in which sacrificial material 330 is an SOD, the structure may be moved from the wet cleaning tool 439 (e.g., through moist atmosphere) to the removal tool 445, at which sacrificial material 330 may be removed by a dry etch to form the structure of FIG. 2E, as described previously.

Figure 5:
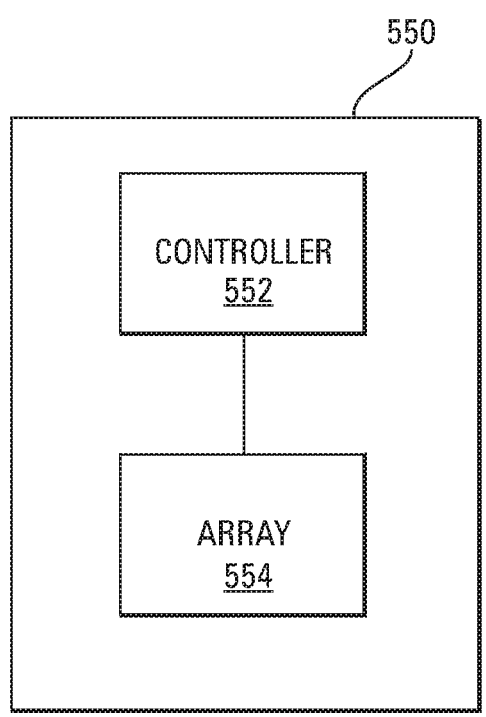
FIG. 5 is a block diagram illustration of an apparatus formed, at least in part, in accordance with a number of embodiments of the present disclosure.

FIG. 5 is a block diagram of an apparatus, such as a memory device 550. For example, memory device 550 may be a volatile memory device, such as a DRAM, a non-volatile memory device, such as NAND flash or NOR flash, among others. For example, memory device 550 may be formed, at least in part, using the processing previously described, such as in conjunction with FIGS. 2A-2F and FIG. 3.

Memory device 550 includes a controller 552, such as an application specific integrated circuit (ASIC), coupled to a memory array 554, such as a DRAM array, a NAND array, a NOR array, among others. For example, memory array 454 might be formed, at least in part, according to the processing described previously.

The controller 552 can control the operations on the memory device 550, and of the memory array 554, including data sensing (e.g., reading) and data programming (e.g., writing), for example. Memory device 550 may be coupled to a host device (not shown in FIG. 5).

Embodiments of the disclosure use sacrificial materials to close openings in structures (e.g., to be used in semiconductor devices, such as integrated circuits, memory devices, MEMS, and the like), such as between features in the structures. The sacrificial materials prevent condensate from forming in the openings as the structures are moved through moist atmospheres between tools, thereby preventing the features from toppling.

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method of forming a semiconductor device, comprising:

forming a plurality of features in a structure using a dry removal tool;

closing openings between the features with a sacrificial material at the dry removal tool;

moving the structure to a wet cleaning tool; and removing the sacrificial material and residue left from forming the plurality of features using the wet cleaning tool.

2. The method of claim 1, wherein the sacrificial material is a dielectric material or a conductive material.

3. The method of claim 1, wherein the sacrificial material is soluble in a solvent.

4. The method of claim 1, wherein different portions of the dry removal tool are respectively located in different processing chambers, and the method further comprises:

forming the plurality of features in one of the chambers; and closing the openings in the other one of the chambers.

5. A method of forming a semiconductor device, comprising:

forming a plurality of features in a structure using a dry removal tool;

closing openings between the features with a first sacrificial material at the dry removal tool;

moving the structure to a wet cleaning tool;

removing the first sacrificial material using the wet cleaning tool;

after removing the first sacrificial material, closing the openings with a second sacrificial material at the wet cleaning tool;

moving the structure to a deposition tool; and removing second solid sacrificial material at the deposition tool by sublimation.

6. The method of claim 5, further comprising after removing the second sacrificial material, using the deposition tool to form an additional material on the structure.

7. The method of claim 5, wherein removing second solid sacrificial material by sublimation comprises setting a pressure and temperature at the deposition tool so the second solid sacrificial material sublimates.

\* \* \* \* \*